TRANSISTOR AVALANCHE MODE PULSE GENERATOR

Filed Nov. 4, 1964

INVENTORS
RAYMOND H. JAMES
GEORGE E. MARKS
BY Thomas J. Nikolai
ATTORNEY

United States Patent Office 3,263,098

Patented July 26, 1966

3,263,098

TRANSISTOR AVALANCHE MODE PULSE GENERATOR

George E. Marks, Minneapolis, and Raymond H. James, Bloomington, Minn., assignors to Sperry Rand Corporation, New York, N.Y., a corporation of Delaware Filed Nov. 4, 1964, Ser. No. 408,918
6 Claims. (Cl. 307—88.5)

This invention relates in general to electronic pulse forming apparatus and in particular to solid state logic circuits.

With the advent of the mass production of digital computers, it has been becoming increasingly desirable to utilize large numbers of similar circuits packaged in individual plug-in modules or "card types." Such circuits, have in the past been mounted on printed circuit boards with all components affixed thereto in a substantially permanent manner with the entire assembly coupled into the system by mounting in plug-in type rack mounts. With the need for more highly compact packaging techniques, a still further improvement in high density packaging has resulted in the new field of "microelectronics" which may be defined as that entire body of electronic art that is connected with or applied to the realization of electronic systems from extremely small electronic parts. One technique utilized in this still larger generic field is devoted to "semi-conductor integrated circuits" which may be defined as a functional electronic block wherein both active and passive component parts are produced integrally with, and inseparable from, an active substrate. As regions in each block may be caused to behave as conventional circuit elements, many diffused resistors, diodes and transistors may be fabricated in the same block. The present invention is directed towards such a circuit that can be fabricated within present-day state-of-the-art capabilities. This invention is particularly directed toward a transistorized pulse generator operating in the avalanche mode and capable of providing a substantially rectangular output pulse of 50.0 nanoseconds duration and having a rise and fall time of 1.0 nanosecond.

Accordingly, it is a primary object of the present invention to provide a solid state logic module.

Another object of the present invention is to provide a transistorized pulse generator operating in the avalanche mode and capable of providing a substantially rectangular output pulse of approximately 50.0 nanoseconds duration and having a rise and a fall time of approximately 1.0 nanosecond.

Another object of the present invention is to provide a solid state circuit that can be readily produced by present day state-of-the-art semiconductor integrated circuit techniques.

A still further object of this invention is to provide a pulse forming apparatus utilizing two avalanche-mode-operating, opposing-output-signal-producing transistors to generate a high-power short-duration pulse of substantially negligible rise and fall times.

These and other more detailed and specific objectives will be disclosed in the course of the following specification, reference being had to the accompanying drawings, in which.

Figure 1:
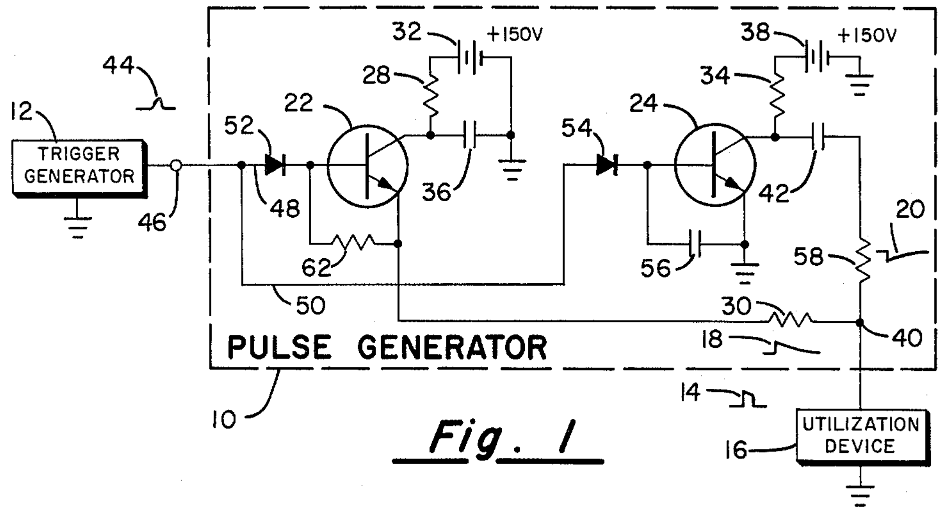
FIG. 1 illustrates an exemplary embodiment of the present invention wherein there is disclosed a circuit schematic of a solid state transistorized pulse generator.
Figure 2:
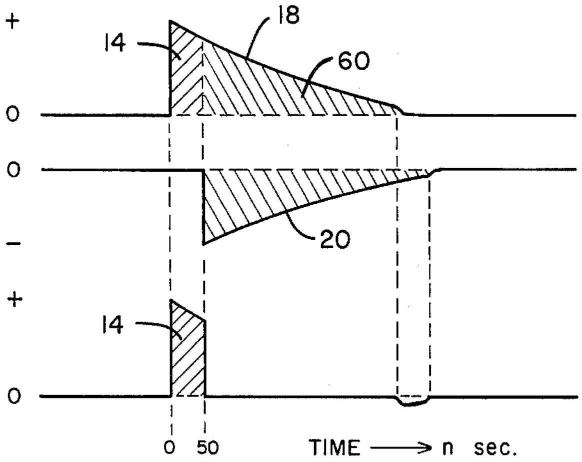
FIG. 2 illustrates the signal waveforms associated with the circuit of FIG. 1.

As stated above the present invention is related in general to a solid state pulse forming circuit module and in patricular to such a circuit that is capable of generating high-power short-duration pulses of extremely short rise and fall times. The illustrated embodiment of FIG. 1 is particularly directed toward a use as a constant current type pulse generator generating a strobe pulse that functions as a flux gate for gating a sampled portion of a transient signal into a concurrently coupled magnetizable memory element. Such a use as a strobe pulse generator is more fully disclosed in the copending application of F. G. Hewitt et al., Serial No. 401,005, filed October 2, 1964, and assigned to the same assignee as is the present invention. It is an essential characteristic of such a strobe pulse that its waveform have extremely short duration rise and fall times to provide a sharp transition period for the flux gating function. Prior art pulse generating devices utilizing transistors operating in the avalanche mode provide an output pulse having a short duration rise time but a relatively long duration fall time due to the fact that such avalanching circuits have relatively long duration turn-off times as compared to their turn-on times. The present invention overcomes this disadvantage of the prior art circuits by utilizing the short duration turn-on time of two opposing-output-signal-producing transistors to provide an output pulse having a rise and a fall time of the order of 1.0 nanosecond. As the avalanche mode of operation of transistors for the generation of nanosecond duration pulses is well known in the art no detailed discussion on the theory of such operation shall be given here. For a good discussion of such avalanching circuits, see the article entitled, "Producing 500–W Nanosecond Pulses With Avalanche Transistors," Electronic Design, p. 62, October 11, 1963.

With particular reference to the illustrated embodiment of FIG. 1 there is illustrated the pulse generator 10 which when triggered by trigger generator 12 couples strobe pulse 14 to utilization device 16. Strobe pulse 14 is produced by the net effect of opposite polarity signals 18 and 20 which signals are the output signal waveforms produced by the avalanching of transistors 22 and 24, respectively, which transistors are of a similar conductivity type having avalanche multiplication characteristics.

Prior to the time $t=0$, both transistors 22 and 24 are properly biased into their normal nonconducting mode by the biasing arrangement of resistors 28 and 30 and battery 32 associated with transistor 22 and of resistor 34 and battery 38 associated with transistor 24 providing no significant output signal at output terminal 40. At this time capacitors 36 and 42, which capacitors are directly coupled to the collectors of their associated transistors 22 and 24, respectively, are charged to their full charging voltage through their associated charging resistors 28 and 34.

At time $t=0$, trigger generator 12 couples trigger pulse 44 to input terminal 46 of pulse generator 10. Trigger pulse 44 is in turn coupled to the bases of transistors 22 and 24 by way of conductors 48 and 50 and diodes 52 and 54, respectively. Trigger pulse 44 at the base of transistor 22 lowers the avalanche breakdown voltage of transistor 22 causing transistor 22 to trigger into an unstable avalanche condition (conducting). The avalanche breakdown of transistor 22 causes its collector-base-emitter junctions to appear as a short circuit to capacitor 36 permitting capacitor 36 to discharge therethrough and across resistor 30 to output terminal 40; resistor 62 forms a low impedance path coupling the base-emitter junction of transistor 22 providing avalanche multiplication. The high resistance of resistor 28, in the order of 50K ohm, effectively isolates battery 32 from the collector of transistor 22 during this discharge of capacitor 36. Transistor 22 continues in the avalanche mode until the current flow through the collector-base-emitter junctions is insufficient to sustain the avalanche process whereby transistor 22 returns to its normal nonconducting mode.

Additionally, at time $t=0$ trigger pulse 44, at the base of transistor 24, is instantaneously bypassed to ground by capacitor 56 charging capacitor 56 exponentially toward the voltage applied by trigger pulse 44. As capacitor 56 charges after a predetermined time interval to the level of the avalanche switching threshold at the base of transistor 24, transistor 24 is triggered into an unstable avalanche condition causing its collector-base-emitter junctions to appear as a short circuit to capacitor 42 permitting capacitor 42 to discharge therethrough and across resistor 58 from output terminal 40; capacitor 56 forms a low impedance path coupling the base-emitter junction of transistor 24 providing avalanche multiplication. The high resistance of resistor 34, in the order of 50K ohm, effectively isolates battery 38 from the collector of transistor 24 during this discharge of capacitor 42. Transistor 24 continues in the avalanche mode until the current flow through the collector-base-emitter junctions is insufficient to sustain the avalanche process whereby transistor 24 returns to its normal nonconducting mode.

Consequently, the net effect of the opposite polarity signals 18 and 20, which signals are the output signal waveforms produced by the discharging of capacitors 36 and 42 through their associated transistors 22 and 24, flowing through their associated resistors 30 and 58 are subtractive as regards output terminal 40 producing at output terminal 40 a signal that is the algebraic sum of signals 18 and 20.

By varying the values of the circuit parameters of pulse generator 10 it is apparent that the operating characteristics of pulse generator 10 can provide an output pulse 14 of a wide range of pulse durations and amplitudes. The peak amplitude of pulse 14 is substantially determined by the characteristics of capacitor 36, resistor 30 (and of course, the impedance of the particular utilization device 16 effected) and battery 32 while the duration of pulse 14 is substantially determined by the characteristics of capacitor 56, diode 54 and the waveform of trigger pulse 44:

The RC time constant of the capacitor 56—diode 54 charging circuit through trigger generator 12 (to ground) determines the time delay between initiation of the avalanching of transistor 22 and transistor 24 and thus the duration of pulse 14;

The circuit characteristics of the discharge paths of capacitor 36 and of capacitor 42 through transistor 22 and transistor 24, respectively, are adjusted such that portion 60 of signal 18 is of substantially the same amplitude, but of opposite polarity, to signal 20 thus producing a negligible output signals at output terminal 40 after the avalanching of transistor 24.

In order to facilitate an understanding of the operation of the present invention the following group of actual values for the elements of FIG. 1 are presented. It should be understood that the principles of operation of this circuit may be present in circuits having a wide range of individual specifications so that the list of values here presented should not be construed as a limitation:

| | |
|---|---|
| Transistors, **22, 24** | 2N697 (Sylvania). |
| Diodes, **52, 54** | FD100 (Fairchild). |
| Capacitors, **36, 44** | 0.01 $\mu$fd. ceramic. |
| Capacitor, **56** | 0.001 $\mu$fd. ceramic. |
| Resistors, **30, 58** | 33 ohms. 1W$\pm$5%. |
| Resistors, **28, 34** | 33K ohms. 1W$\pm$5%. |
| Resistor, **62** | 270 ohms. 1W$\pm$5%. |
| Batteries, **32 38** | 150 volts. |

It is understood that suitable modifications may be made in the structure as disclosed provided such modifications come within the spirit and scope of the appended claims. Having now, therefore, fully illustrated and described our invention, what we claim to be new and desire to protect by Letters Patent, is:

1. A pulse generator, comprising:

first and second similar conductivity type transistors, each having avalanche multiplication characteristics and having an emitter electrode, a collector electrode and a base electrode;

output means;

input means coupled to the base electrodes of said first and second transistors and adapted to receive a trigger pulse for triggering said first transistor into an unstable avalanche condition and after a predetermined time interval for triggering said second transistor into an unstable avalanche condition;

a first capacitor for coupling said first transistor collector electrode to ground potential;

a first resistor coupling said first transistor emitter electrode to said output means;

a serially arranged second capacitor and second resistor coupling said second transistor collector electrode to said output means;

a third capacitor intercoupling said second transistor base electrode and emitter electrode for establishing said predetermined time interval;

means for coupling said second transistor emitter electrode to ground potential;

third and fourth resistors for coupling the collector electrodes of said first and second transistors, respectively, to first and second reference potentials, respectively;

said first and second transistors when triggered into said unstable avalanche condition causing said first and second capacitors, respectively, to discharge currents therethrough and across said first and second resistors, respectively, said currents substantially cancelling each other at said output means except during said predetermined time interval;

said uncancelled currents causing a unipolar output pulse of a duration equal to said predetermined time interval to be coupled to said output means.

2. A pulse generator, comprising:

first and second similar conductivity type transistors, each having avalanche multiplication characteristics and having an emitter electrode, a collector electrode and a base electrode;

output means;

input means coupled to the base electrodes of said first and second transistors and adapted to receive a trigger pulse for triggering said first transistor into avalanche breakdown and after a predetermined time interval for triggering said second transistor into avalanche breakdown;

means adapted to be coupled to biasing means for normally biasing said first and second transistors into a nonconducting condition;

a first capacitor adapted to couple said first transistor collector electrode to ground potential;

a first resistor coupling said first transistor emitter electrode to said output means;

a serially arranged second capacitor and second resistor coupling said second transistor collector electrode to said output means;

a third capacitor intercoupling said second transistor base electrode and emitter electrode for establishing said predetermined time interval;

means adapted to couple said second transistor emitter electrode to ground potential;

said first and second transistors when triggered into said avalanche breakdown causing said first and second capacitors, respectively, to discharge currents therethrough and across said first and second resistors, respectively, said currents substantially cancelling each other at said output means except during said predetermined time interval;

said uncancelled currents causing a unipolar output pulse of a duration equal to said predetermined time interval to be coupled to said output means.

3. A pulse generator, comprising:

first and second similar conductivity type transistors, each having avalanche multiplication characteristics and having an emitter electrode, a collector electrode and a base electrode;

input means coupled to the base electrodes of said first and second transistors;

utilization means;

trigger generator means adapted to couple a trigger pulse to said input means for triggering said first transistor into avalanche breakdown and after a predetermined time interval for triggering said second transistor into avalanche breakdown;

means for normally biasing said first and second transistors into a nonconducting condition;

a first capacitor coupling said first transistor collector electrode to ground potential;

a first resistor coupling said first transistor emitter electrode to said utilization means;

a serially arranged second capacitor and second resistor coupling said second transistor collector electrode to said utilization means;

a third capacitor intercoupling said second transistor base electrode and emitter electrode for establishing said predetermined time interval;

means coupling said second transistor emitter electrode to ground potential;

said first and second transistors when triggered into said avalanche breakdown causing said first and second capacitors, respectively, to discharge currents therethrough and across said first and second resistors, respectively, said currents substantially cancelling each other at said utilization means except during said predetermined time interval;

said uncancelled currents causing a unipolar output pulse of a duration equal to said predetermined time interval to be coupled to said utilization means.

4. A pulse generator, comprising:

first and second similar conductivity type transistors, each having avalanche multiplication characteristics and having an emitter electrode, a collector electrode and a base electrode;

an output terminal;

a first capacitor associated with and for coupling the collector electrode of said first transistor to ground potential;

a first resistor coupling the emitter electrode of said first transistor to said output terminal;

a serially arranged second capacitor and second resistor coupling the collector electrode of said second transistor to said output terminal;

means for coupling said second transistor emitter electrode to ground potential; third and fourth resistors for coupling the collector electrodes of said first and second transistors, respectively, to first and second voltage sources, respectively;

means coupled to the base electrodes of said first and second transistors and adapted to receive a trigger pulse for triggering one of said transistors into an unstable avalanche condition during which avalanche breakdown occurs in the emitter-base-collector junctions of said one transistor to permit its associated capacitor to discharge current therethrough and across its associated resistor in a first direction and after a predetermined time interval for triggering the other of said transistors into an unstable avalanche condition during which avalanche breakdown occurs in the emitter-base-collector junctions of said other transistor to permit its associated capacitor to discharge current therethrough and across its associated resistor in a second and opposite direction;

said opposing directioned currents substantially cancelling each other at said output terminal except during said predetermined time interval.

5. A pulse generator, comprising:

first and second similar conductivity type transistors, each having avalanche multiplication characteristics and having an emitter electrode, a collector electrode and a base electrode;

an output terminal;

a first capacitor associated with and coupling the collector electrode of said first transistor to ground potential;

a first resistor associated with the emitter electrode of said first transistor and a serially arranged second capacitor and second resistor associated with the collector electrode of said second transistor each coupling the associated electrode to said output terminal;

biasing means for normally biasing said first and second transistors into a nonconducting condition;

a third capacitor intercoupling the emitter electrode and the base electrode of said second transistor;

means for coupling said second transistor emitter electrode to ground potential;

means coupled to the base electrodes of said first and second transistors for triggering one of said transistors into an unstable avalanche condition during which avalanche breakdown occurs in the emitter-base-collector junctions of said one transistor to permit its associated capacitor to discharge current therethrough and across its associated resistor in a first direction and after a predetermined time interval for triggering the other of said transistors into an unstable avalanche condition during which avalanche breakdown occurs in the emitter-base-collector junctions of said other transistor to permit its associated capacitor to discharge current therethrough and across its associated resistor in a second and opposite direction;

said opposing directioned currents substantially cancelling each other at said output terminal except during said predetermined time interval.

6. A pulse generator, comprising:

first and second similar conductivity type transistors, each having avalanche multiplication characteristics and having an emitter electrode, a collector electrode and a base electrode;

an output terminal;

a first capacitor coupling the collector electrode of said first transistor to a first reference potential;

a first resistor coupling the emitter electrode of said first transistor to said output terminal;

means for coupling the emitter electrode of said second transistor to said first reference potential;

a second resistor for coupling the collector electrode of said first transistor to a second reference potential;

a serially arranged second capacitor and third resistor coupling the collector electrode of said second transistor to said output terminal;

a fourth resistor for coupling the collector electrode of said second transistor to said second reference potential;

a third capacitor intercoupling the emitter electrode and the base electrode of said second transistor;

a fifth resistor intercoupling the emitter electrode and the base electrode of said first transistor;

means coupled to the base electrodes of said first and second transistors for triggering said first transistor into an unstable avalanche condition during which avalanche breakdown occurs in the emitter-base-collector junctions of said first transistor to permit its associated first capacitor to discharge current therethrough and across its associated first resistor in a first direction and after a predetermined time interval for triggering the said second transistor into an unstable avalanche condition during which avalanche breakdown occurs in the emitter-base-collector junctions of said second transistors to permit its associated second capacitor to discharge current therethrough and across its associated third resistor in a second and opposite direction;

said opposing directioned currents substantially cancelling each other at said output terminal except during said predetermined time interval.

References Cited by the Examiner

UNITED STATES PATENTS

| | | | |
|---|---|---|---|
| 2,899,554 | 8/1959 | Rosen | 328—58 |
| 2,942,190 | 6/1960 | Fischman | 328—61 |

ARTHUR GAUSS, *Primary Examiner.*

J. ZAZWORSKY, *Assistant Examiner.*